(12) United States Patent
Hong et al.

(10) Patent No.: US 9,156,111 B2
(45) Date of Patent: Oct. 13, 2015

(54) LEAD FREE SOLDER BUMPS

(71) Applicants: MK ELECTRON CO., LTD., Gyeonggi-do (KR); HOSEO UNIVERSITY ACADEMIC COOPERATION FOUNDATION, Chungcheongnam-do (KR); KOREA ADVANCED INSTITUTE OF SCIENCE AND TECHNOLOGY, Daejeon (KR); KOREA INSTITUTE OF INDUSTRIAL TECHNOLOGY, Chungcheongnam-do (KR); KOREA ELECTRONICS TECHNOLOGY INSTITUTE, Gyeonggi-do (KR)

(72) Inventors: Sung Jae Hong, Gyeonggi-do (KR); Keun Soo Kim, Chungcheongnam-do (KR); Chang Woo Lee, Chungcheongnam-do (KR); Jung Hwan Bang, Chungcheongnam-do (KR); Yong Ho Ko, Chungcheongnam-do (KR); Hyuck Mo Lee, Deajeon (KR); Jae Won Chang, Daejeon (KR); Ja Hyun Koo, Daejeon (KR); Jeong Tak Moon, Gyeonggi-do (KR); Young Woo Lee, Incheon (KR); Won Sik Hong, Gyeonggi-do (KR); Hui Joong Kim, Seoul (KR); Jae Hong Lee, Seoul (KR)

(73) Assignees: MK ELECTRON CO., LTD. (KR); HOSEO UNIVERSITY ACADEMIC COOPERATION FOUNDATION (KR); KOREA ADVANCED INSTITUTE OF SCIENCE AND TECHNOLOGY (KR); KOREA INSTITUTE OF INDUSTRIAL TECHNOLOGY (KR); KOREA ELECTRONICS TECHNOLOGY INSTITUTE (KR)

( * ) Notice: Subject to any disclaimer, the term of this patent is extended or adjusted under 35 U.S.C. 154(b) by 0 days.

(21) Appl. No.: 14/558,089

(22) Filed: Dec. 2, 2014

(65) Prior Publication Data
US 2015/0151386 A1      Jun. 4, 2015

(30) Foreign Application Priority Data

Dec. 4, 2013   (KR) ................. 10-2013-0149999

(51) Int. Cl.
| H01L 23/48 | (2006.01) |
| H01L 21/44 | (2006.01) |
| B23K 31/00 | (2006.01) |
| B23K 35/26 | (2006.01) |
| B23K 35/02 | (2006.01) |
| H01L 23/00 | (2006.01) |
| B23K 1/00  | (2006.01) |

(52) U.S. Cl.
CPC ............ *B23K 35/262* (2013.01); *B23K 1/0016* (2013.01); *B23K 35/025* (2013.01); *H01L 24/17* (2013.01); *B23K 2201/40* (2013.01); *B23K 2201/42* (2013.01); *H01L 2224/13147* (2013.01); *H01L 2224/16227* (2013.01); *H01L 2924/014* (2013.01); *H01L 2924/0105* (2013.01); *H01L 2924/01013* (2013.01); *H01L 2924/01014* (2013.01); *H01L 2924/01015* (2013.01); *H01L 2924/01029* (2013.01); *H01L 2924/01032* (2013.01); *H01L 2924/01046* (2013.01); *H01L 2924/01083* (2013.01); *H01L 2924/15747* (2013.01)

(58) Field of Classification Search
CPC ................ H01L 24/14; H01L 2924/01083; H01L 2924/0105; H01L 2924/014; H01L 2924/01029; H01L 2924/15311; H01L 2924/01013; H01L 2924/01046; H01L 24/17; B23K 1/0016; B23K 35/262; B23K 35/025; B23K 2201/40

See application file for complete search history.

(56) References Cited

U.S. PATENT DOCUMENTS

| | | | |
|---|---|---|---|
| 6,187,114 | B1 | 2/2001 | Ogashiwa et al. |
| 7,488,445 | B2 | 2/2009 | Takaoka et al. |
| 7,682,468 | B2 | 3/2010 | Munekata et al. |
| 8,156,646 | B2 * | 4/2012 | Iwai et al. ............ 29/852 |
| 8,227,536 | B2 * | 7/2012 | Watanabe et al. ............ 524/408 |
| 2005/0029666 | A1 * | 2/2005 | Kurihara et al. ............ 257/772 |
| 2008/0191347 | A1 * | 8/2008 | Sawa et al. ............ 257/737 |
| 2008/0237314 | A1 * | 10/2008 | Yu et al. ............ 228/245 |
| 2008/0292493 | A1 | 11/2008 | Lee et al. |
| 2011/0031596 | A1 * | 2/2011 | Gruenhagen et al. ......... 257/666 |
| 2011/0210441 | A1 * | 9/2011 | Lee et al. ............ 257/737 |
| 2011/0303448 | A1 | 12/2011 | Anderson et al. |
| 2012/0306104 | A1 * | 12/2012 | Choi et al. ............ 257/782 |
| 2013/0175688 | A1 | 7/2013 | Lee et al. |

FOREIGN PATENT DOCUMENTS

JP  10-0118783 A  5/1998

* cited by examiner

*Primary Examiner* — Alonzo Chambliss

(74) *Attorney, Agent, or Firm* — Volpe and Koenig, P.C.

(57) ABSTRACT

Provided are a lead-free solder, a solder paste, and a semiconductor device, and more particularly, a lead-free solder that includes Cu in a range from about 0.1 wt % to about 0.8 wt %, Pd in a range from about 0.001 wt % to about 0.1 wt %, Al in a range from about 0.001 wt % to about 0.1 wt %, Si in a range from about 0.001 wt % to about 0.1 wt %, and Sn and inevitable impurities as remainder, a solder paste and a semiconductor device including the lead-free solder. The lead-free solder and the solder paste are environment-friendly and have a high high-temperature stability and high reliability.

13 Claims, 3 Drawing Sheets

LEAD FREE SOLDER BUMPS

RELATED APPLICATION

This application claims the benefit of Korean Patent Application No. 10-2013-0149999, filed on Dec. 4, 2013, in the Korean Intellectual Property Office, the disclosure of which is incorporated herein in its entirety by reference.

BACKGROUND

1. Field

One or more exemplary embodiments relate to a lead-free solder, a solder paste, and a semiconductor device.

2. Description of the Related Art

Printed circuit boards (PCBs) have been widely used in home appliances, such as televisions, mobile phones, or computers. Recently, a lot of PCBs have been used in automobiles. For solders that are used in home appliances, a lot of Sn—Pb alloy group products have been used. In particular, lead (Pb) acts as a component that determines wettability, strength, and mechanical characteristics of a Sn—Pb alloy. Also, since lead is included in the Sn—Pb alloy, the melting point of the solder may be lowered to 183° C., and thus, thermal damage that occurs in a soldering process between an electronic part and a semiconductor device can be prevented.

Due to the strict environmental regulations in relation to Pb, a lead-free solder alloy, that is, a ternary system of Sn—Ag—Cu has been proposed. However, since the ternary system is weak to oxidation and has low spreadability and low wettability, workability is poor and resistance to impact is low. Also, the ternary system is inappropriate for an atmosphere of high temperature of over 130° C. as in an engine room of an automobile, and is expensive since Ag is included.

SUMMARY

One or more exemplary embodiments include a lead-free solder that is environment-friendly, has excellent high-temperature stability, and has high reliability.

One or more exemplary embodiments include a solder paste that is environment-friendly, has high high-temperature stability, and has high reliability.

One or more exemplary embodiments include a semiconductor device that is environment-friendly, has high high-temperature stability, and has high reliability.

Additional aspects will be set forth in part in the description which follows and, in part, will be apparent from the description, or may be learned by practice of the presented embodiments.

According to one or more exemplary embodiments, a lead-free solder includes: Cu in a range from about 0.1 wt % to about 0.8 wt %; Pd in a range from about 0.001 wt % to about 0.1 wt %; Al in a range from about 0.001 wt % to about 0.1 wt %; Si in a range from about 0.001 wt % to about 0.1 wt %; and Sn and unavoidable impurities as remainders.

The lead-free solder may further include at least one element selected from the group consisting of Ge in a range from about 0.001 wt % to about 0.05 wt %, Bi in a range from about 0.001 wt % to about 0.05 wt %, P in a range from about 0.001 wt % to about 0.05 wt %, and In in a range from about 0.001 wt % to about 0.05 wt %.

The lead-free solder may have an elongation rate in a range from about 45% to about 65%.

According to one or more exemplary embodiments, a solder paste includes a flux in a range from 5 to 25 parts by weight per 100 parts by weight of a lead-free solder, wherein the lead-free solder of 100 parts by weight has a composition described above.

According to one or more exemplary embodiments, a semiconductor device includes: a substrate in which a plurality of first terminals are formed; a semiconductor chip that is mounted on the substrate and includes a plurality of second terminals that respectively correspond to the first terminals; and a plurality of solder bumps that respectively connect the corresponding first and second terminals, wherein the solder bumps comprise: Cu in a range from about 0.1 wt % to about 0.8 wt %, Pd in a range from about 0.001 wt % to about 0.1 wt %, Al in a range from about 0.001 wt % to about 0.1 wt %, Si in a range from about 0.001 wt % to about 0.1 wt %, and Sn and unavoidable impurities as balance.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
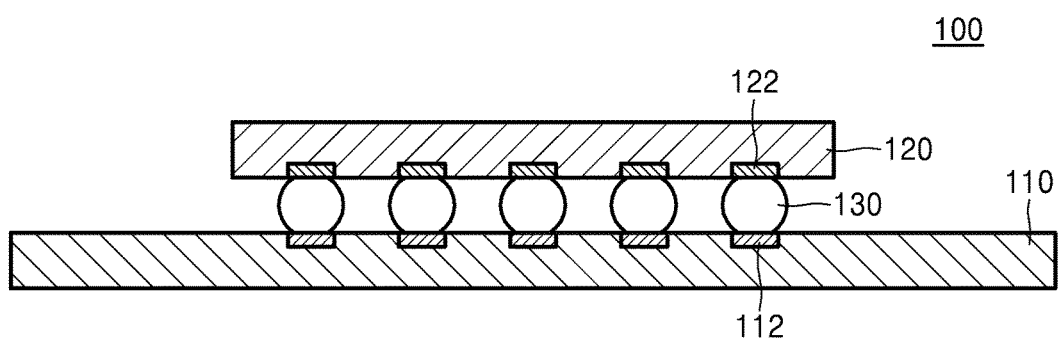
FIG. 1 is a cross-sectional view of a semiconductor part according to an embodiment of the inventive concept.

Reference will now be made in detail to embodiments, examples of which are illustrated in the accompanying drawings. In this regard, the present embodiments may have different forms and should not be construed as being limited to the descriptions set forth herein. These embodiments are provided so that this disclosure will be thorough and complete, and will fully convey the scope of the invention to one of ordinary skill in the art. Like reference numerals refer to like elements throughout. In the drawings, various elements and regions are schematically drawn. Accordingly, the embodiments according to the inventive concept are not limited to the relative sizes and gaps depicted in the accompanying drawings.

It will be understood that, although the terms 'first', 'second', etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

The terminologies used herein are for the purpose of describing embodiments only and are not intended to be limiting of exemplary embodiments. The singular forms include the plural forms unless the context clearly indicates otherwise. It will be further understood that the terms "comprises," and/or "includes," when used herein, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used in dictionaries, should be interpreted as having a meaning that is consistent with their meaning in the context of the relevant art and will not be interpreted in an idealized or overly formal senses unless expressly so defined herein.

In the embodiments according to the inventive concept, weights are indicated by weight percentage wt % of the corresponding component in the total weight of an alloy.

A lead-free solder according to an embodiment of the inventive concept may include Cu, Pd, Al, and Si by using Sn as the main component. More specifically, the lead-free solder according to an embodiment of the inventive concept may include Cu in a range from about 0.1 wt % to about 0.8 wt %, Pd in a range from about 0.001 wt % to about 0.1 wt %, Al in a range from about 0.001 wt % to about 0.1 wt %, Si in a range from about 0.001 wt % to about 0.1 wt %, and Sn and inevitable impurities as remainders.

Here, the 'main component' denotes a component of which weight exceeds 50% of the total weight of an alloy. Also, in the lead-free solder according to the embodiments of the inventive concept, inevitable impurity elements may be included.

Copper may affect the tensile strength of a lead-free solder. If the Cu content is too little, the tensile strength of the lead-free solder may not be increased as desired. If Cu content is too large, the lead-free solder may be hardened, and thus, texture damage may easily occur.

Also, Cu may affect the high temperature stability of the lead-free solder. If the Cu content is too little, the lead-free solder may be thermally weak, and thus, damaged at a high temperature. If the Cu content is too large, Cu dross may be generated, and thus, soldering may be difficult.

The lead-free solder according to an embodiment of the inventive concept may include Cu in a range from about 0.1 wt % to about 0.8 wt %. The lead-free solder according to an embodiment of the inventive concept may include approximately 0.5 wt % of Cu.

The lead-free solder according to an embodiment of the inventive concept may include Pd in a range from about 0.001 wt % to about 0.1 wt %. The lead-free solder according to an embodiment of the inventive concept may include Pd in a range from about 0.005 wt % to about 0.05 wt %. The lead-free solder according to an embodiment of the inventive concept may include approximately 0.01 wt % of Pd.

Pd may affect the tensile strength of the lead-free solder. If the Pd content is too little, the tensile strength of the lead-free solder may not be increased as desired. Also, the dissolution of an electrode by the lead-free solder may be difficult to reduce. If Pd content is too large, the lead-free solder may be hardened, and thus, texture damage may easily occur. Also, if the Pd content is too large, it may be uneconomical.

The lead-free solder according to an embodiment of the inventive concept may not substantially include Ag. Here, "the lead-free solder may not substantially include Ag" denotes that a minor amount of Ag may be included as an unavoidable impurity.

Since the lead-free solder according to an embodiment of the inventive concept does not substantially include Ag, the lead-free solder according to an embodiment of the inventive concept is cheaper than an Sn—Ag—Cu lead-free solder of the related art.

The lead-free solder according to an embodiment of the inventive concept may include Al in a range from about 0.001 wt % to about 0.1 wt %. The lead-free solder may include Al in a range from about 0.01 wt % to about 0.05 wt %. The lead-free solder may include approximately 0.03 wt % of Al.

Al may affect the elongation rate of the lead-free solder. If the Al content is too little, the increase in the elongation rate, which is an advantage of the inventive concept, may not be achieved. If the Al content is too large, as the same as when the Al content is too little, the elongation rate may be reduced.

The lead-free solder according to an embodiment of the inventive concept may include Si in a range from about 0.001 wt % to about 0.1 wt %. The lead-free solder may include Si in a range from about 0.001 wt % to about 0.02 wt %. The lead-free solder may include approximately 0.01 wt % of Si.

If the Si content is too little, the advantages of the inventive concept, that is, the increase in wettability and the elongation rate may not be achieved. If the Si content is too large, crystal grains are coarsened due to segregation and mechanical characteristics are reduced.

The lead-free solder may have an elongation rate in a range from about 45% to about 65%. If the elongation rate of the lead-free solder is too low, brittleness is excessively increased, and thus, may be weak to external impact and reliability is reduced. If the elongation rate of the lead-free solder is too high, tensile strength may be insufficient.

The lead-free solder according to an embodiment of the inventive concept may further include at least one element selected from the group consisting of Ge, Bi, P, and In. The above elements may assist the increase in the wettability of the lead-free solder.

The content of Ge may be in a range from about 0.001 wt % to about 0.05 wt %. The content of Bi may be in a range from about 0.001 wt % to about 0.05 wt %. The content of P may be in a range from about 0.001 wt % to about 0.05 wt %. The content of In may be in a range from about 0.001 wt % to about 0.05 wt %.

The lead-free solder is environment-friendly and has excellent high-temperature stability due to its high melting point, and has high reliability due to high wettability and elongation rate. Also, the lead-free solder may be manufactured at a low cost since the lead-free solder does not include Ag.

According to an aspect of the inventive concept, there is provided a solder paste. The solder paste may include flux between 5 to 25 parts by weight per 100 parts by weight of a lead-free solder.

The flux may be, for example, Rosin Mildly Activated (RMA)-type, and may be in a liquid state at room temperature. However, the flux according to the inventive concept is not limited thereto.

The lead-free solder may be the lead-free solder described above. Thus, the descriptions about the lead-free solder will not be repeated.

A mixture of the lead-free solder and a flux may form a paste phase at room temperature.

Besides the above, the lead-free solder may be provided in a solder bar state or a solder ball state.

According to an aspect of the inventive concept, there is provided a semiconductor device 100. FIG. 1 shows the semiconductor device 100 according to an embodiment of the inventive concept.

Referring to FIG. 1, a substrate 110 is provided, wherein a plurality of first terminals 112 are formed therein. The substrate 110 may be, for example, a printed circuit board (PCB) or a flexible printed circuit board (FPCB).

The first terminals 112 may be bump pads to which bumps may be combined, and may include a single metal layer or have a structure in which a plurality of metals are stacked. Also, the first terminals 112 may be formed of Cu, Al, Ni, or an alloy of two or more of these metals, but are not limited thereto.

A semiconductor chip 120 may be mounted on the substrate 110, wherein the semiconductor chip 120 has a plurality of second terminals 122 which respectively correspond to the first terminals 112. The second terminals 122 may be, for example, flash memories, phase-change RAMs (PRAMs), resistive RAMs (RRAMs), ferroelectric RAMs (FeRAMs), or magnetic RAMs (MRAMs), but are not limited thereto. The flash memories may be a NAND flash memory. The semiconductor chip 120 may be formed as a single semiconductor chip or a stack of a plurality of semiconductor chips. Also, the semiconductor device 120 may itself be a single semiconductor chip or may be a semiconductor package in which a semiconductor chip is mounted on a package substrate and the semiconductor chip is sealed by an encapsulating member.

The first terminals 112 and the second terminals 122 may be connected by solder bumps 130. At this point, the solder bumps 130 may have a composition described above.

When the substrate 110 and the semiconductor device 120 are connected by using the solder bumps 130, the semiconductor device 120 is environment-friendly since lead is not included, and due to its high temperature stability and high wettability, the semiconductor device 120 may be useful to an automobile semiconductor.

According to an aspect of the inventive concept, there is provided a lead-free solder and a solder paste, and the lead-free solder is environment-friendly, has excellent high-temperature stability, and high reliability.

Here, the configurations and advantages of the inventive concept will be described in detail with reference to practical embodiments and comparative examples. However, it should be understood that the embodiments described below are only to make those of ordinary skill in the art to clearly understand the current inventive concept and not to limit the scope of the inventive concept.

<Differential Scanning Calorimetry (DSC) Analysis>

After preparing samples of 5 mg having compositions as shown in Table 1, a DSC analysis was performed under a nitrogen atmosphere. A temperature was increased at a rate of 5° C./min.

TABLE 1

| | Composition (wt %) | | | | | Onset temp. (° C.) (Heating, T1) | Onset temp. (° C.) (Cooling, T2) | Undercooling (° C.) (ΔT = T1 − T2) |
|---|---|---|---|---|---|---|---|---|
| | Sn | Cu | Pd | Al | Si | | | |
| Example 1 | balance | 0.5 | 0.01 | 0.01 | 0.001 | 229.9 | 227 | 2.9 |
| Example 2 | balance | 0.5 | 0.01 | 0.03 | 0.004 | 231 | 227 | 4 |
| Example 3 | balance | 0.5 | 0.01 | 0.05 | 0.007 | 232.2 | 227 | 5.2 |
| Example 4 | balance | 0.5 | 0.01 | 0.08 | 0.015 | 233.7 | 226.8 | 6.9 |
| Comparative Example 1 | balance | 0.5 | — | — | — | 229.5 | 227.9 | 1.6 |

As a result, as shown in Table 1, the onset temperature is in a range from about 230° C. to about 234° C. during heating and is approximately 227° C. during cooling. That is, the lead-free solders according to Embodiment 1 through 4 have melting points that are similar to the Sn—Cu based solder according to the related art. Also, the melting points thereof are much higher than a melting point (217° C.) of a conventional lead-free solder having a composition of Sn/3%-Ag/0.5%-Cu, and thus, excellent high-temperature stability is improved.

<Wettability Analysis>

Figure 2A:
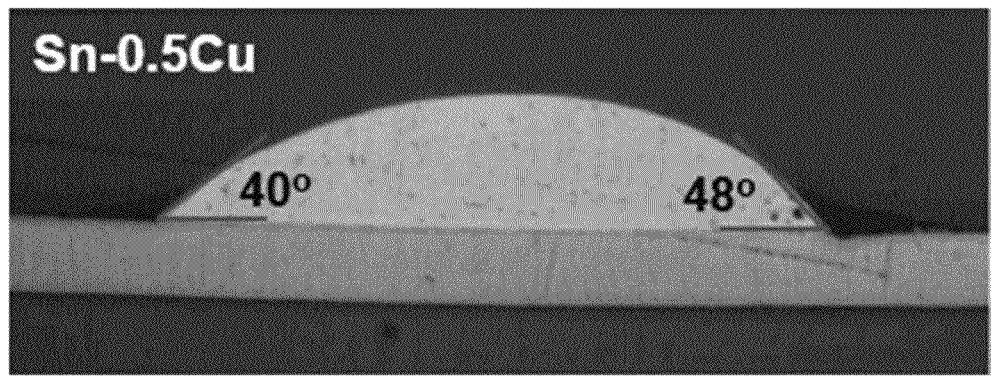
FIGS. 2A through 2D are photos showing test results of wettability of lead-free solders respectively manufactured according to a Comparative Example and Examples 1 through 3 according to the inventive concept.
Figure 2B:
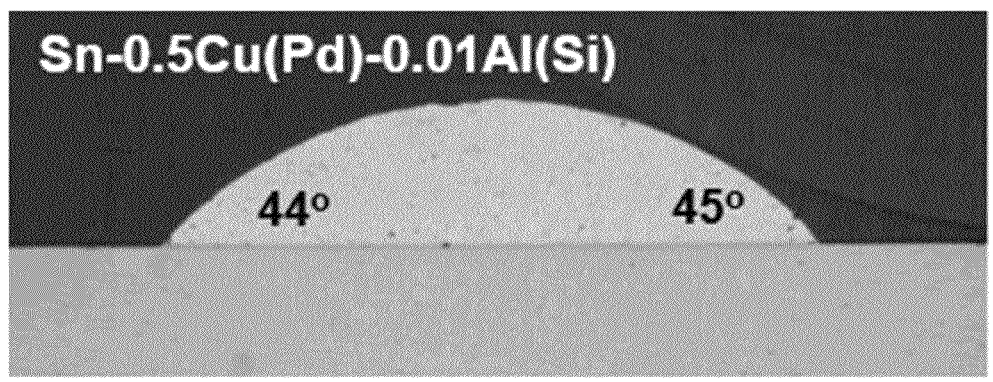
Figure 2C:
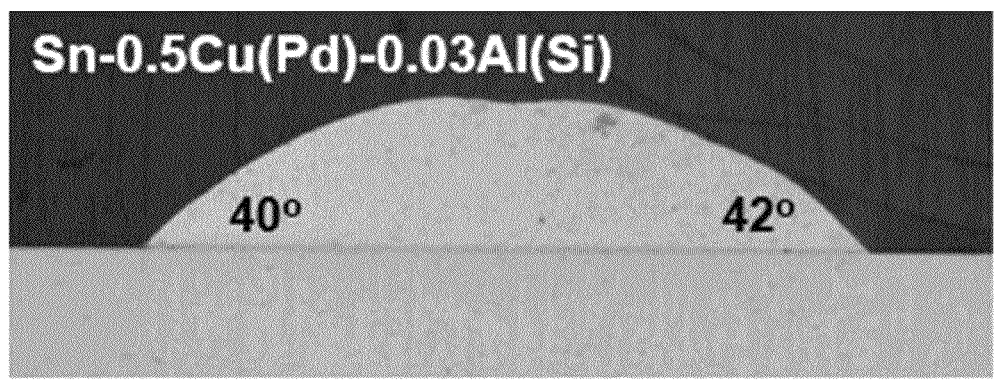
Figure 2D:
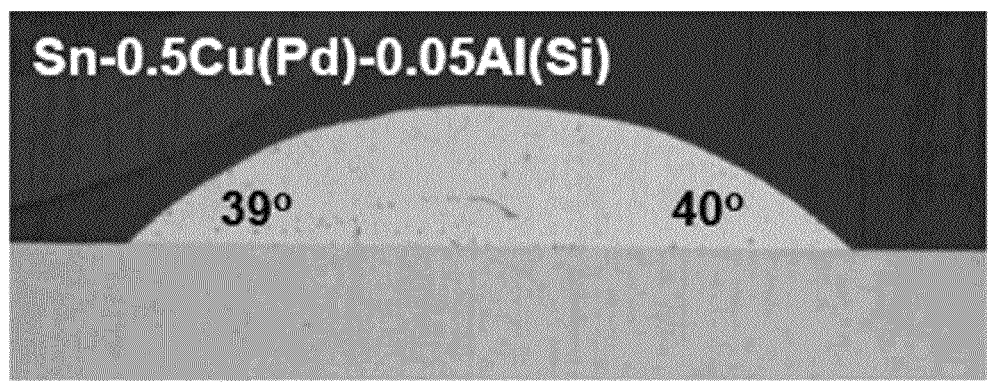

Wettability was evaluated by measuring a contact angle on a copper substrate after reflowing a solder ball having a diameter of 500 μm for 90 seconds at 250° C. An RMA-type flux was used, and the results are summarized in Table 2. Also, the results of the Comparative Example 1 and Examples 1 through 3 are respectively shown in FIGS. 2A through 2D. That is, FIG. 2A shows the result of the Comparative Example 1, FIG. 2B shows the result of Embodiment 1, FIG. 2C shows the result of Embodiment 2, and FIG. 2D shows the result of Embodiment 3.

TABLE 2

| | Composition (wt %) | | | | | | | | Contact angle |
|---|---|---|---|---|---|---|---|---|---|
| | Sn | Cu | Pd | Al | Si | Ge | Bi | P | In | (°) |
| Example 1 | balance | 0.5 | 0.01 | 0.01 | 0.001 | — | — | — | — | 44-45 |
| Example 2 | balance | 0.5 | 0.01 | 0.03 | 0.004 | — | — | — | — | 40-42 |
| Example 3 | balance | 0.5 | 0.01 | 0.05 | 0.007 | — | — | — | — | 39-40 |
| Example 4 | balance | 0.5 | 0.01 | 0.08 | 0.015 | — | — | — | — | 38-39 |
| Example 5 | balance | 0.5 | 0.01 | 0.05 | 0.007 | 0.01 | — | — | — | 37-39 |
| Example 6 | balance | 0.5 | 0.01 | 0.05 | 0.007 | — | 0.01 | — | — | 37-39 |
| Example 7 | balance | 0.5 | 0.01 | 0.05 | 0.007 | — | — | 0.03 | — | 37-39 |
| Example 8 | balance | 0.5 | 0.01 | 0.05 | 0.007 | — | — | — | 0.05 | 37-38 |
| Comparative Example 1 | balance | 0.5 | | | | | | | | 40-48 |

As shown in Table 2, in the case of Examples 1 through 3, the contact angle and, thus, the wettability are similar to those of the Comparative Example 1. Also, it is seen that the wettability is improved by the addition of Ge, Bi, P, and In.

<Manufacture of Solder Paste>

After manufacturing powders each having compositions as shown in Examples 1 through 12 and Comparative Examples 1 through 5 by using a vacuum gas atomizer, powders of type-4 having a diameter in a range from about 20 μm to about 38 μm were obtained by using a sieve. At this point, the melting temperature was 550° C. and argon gas was used.

Afterwards, after adding an RMA-type flux for paste 12 parts by weight to per 100 parts by weight of the powder, a solder paste was manufactured by mixing the powder for 3 minutes and 30 seconds at a speed of 1,000 rpm by using a paste mixer.

<Manufacture of Solder Bar and Solder Ball>

Alloy solder bars having compositions as shown in Examples 1 through 12 and Comparative Examples 1 through 5 were manufactured by using a vacuum degassing alloy device. At this point, the process temperature was 500° C.

Also, after performing a bubbling process and a vacuum degassing process to manufacture the alloy solder bars, the resultant products were tapped.

Also, solder balls having a diameter of 0.3 mm were manufactured using the manufactured alloy solder bars.

<Measurement of Elongation Rate>

As shown in Table 3, the elongation rates of solder balls were measured with respect to the manufactured solder balls. The elongation rates of the solder balls were measured based on ASTM E8 by using a Universal Testing Machine 3300, a product of Instron Corp.

TABLE 3

| | Composition (wt %) | | | | | | | | | Elongation rate |
|---|---|---|---|---|---|---|---|---|---|---|
| | Sn | Cu | Pd | Al | Si | Ge | Bi | P | In | (%) |
| Example 1 | balance | 0.5 | 0.01 | 0.01 | 0.001 | — | — | — | — | 45 |
| Example 2 | balance | 0.5 | 0.01 | 0.03 | 0.004 | — | — | — | — | 64 |
| Example 3 | balance | 0.5 | 0.01 | 0.05 | 0.007 | — | — | — | — | 55 |
| Example 4 | balance | 0.5 | 0.01 | 0.05 | 0.015 | — | — | — | — | 58 |
| Example 5 | balance | 0.5 | 0.01 | 0.05 | 0.007 | 0.01 | — | — | — | 56 |
| Example 6 | balance | 0.5 | 0.01 | 0.05 | 0.007 | — | 0.01 | — | — | 57 |
| Example 7 | balance | 0.5 | 0.01 | 0.05 | 0.007 | — | — | 0.03 | — | 59 |
| Example 8 | balance | 0.5 | 0.01 | 0.05 | 0.007 | — | — | — | 0.05 | 58 |
| Example 9 | balance | 0.5 | 0.01 | 0.001 | 0.007 | — | — | — | — | 42 |
| Example 10 | balance | 0.5 | 0.01 | 0.055 | 0.007 | — | — | — | — | 44 |
| Example 11 | balance | 0.5 | 0.01 | 0.05 | 0.021 | — | — | — | — | 45 |
| Example 12 | balance | 0.5 | 0.01 | 0.05 | 0.019 | — | — | — | — | 57 |
| Comparative Example 1 | balance | 0.5 | — | — | — | — | — | — | — | 35 |
| Comparative Example 2 | balance | 0.5 | 0.01 | 0.12 | 0.007 | — | — | — | — | 38 |
| Comparative Example 3 | balance | 0.5 | 0.01 | 0.0008 | 0.007 | — | — | — | — | 35 |
| Comparative Example 4 | balance | 0.5 | 0.01 | 0.05 | 0.11 | — | — | — | — | 37 |
| Comparative Example 5 | balance | 0.5 | 0.01 | 0.05 | 0.0008 | — | — | — | — | 35 |

As shown in Table 3, when the Al content exceeds 0.1 wt % (Comparative Example 2), the elongation rate may not reach 40%. Also, when the Al content is below 0.001 wt % (Comparative Example 3), the elongation rate is similar to the level of the Comparative Example 1 in which Al is not included.

It is seen that when Si content exceeds 0.1 wt % (Comparative Example 4), the elongation rate may not reach to 40%. When Si content is below 0.001 wt % (Comparative Example 5), the elongation rate is similar to that of the Comparative Example 1 in which Al is not included.

While one or more exemplary embodiments have been described with reference to the figures, it will be understood by those of ordinary skill in the art that various changes in form and details may be made therein without departing from the spirit and scope of the inventive concept as defined by the following claims.

What is claimed is:

1. A primarily tin (Sn), lead-free solder comprising:
    Cu in a range from about 0.1 wt % to about 0.8 wt %;
    Pd in a range from about 0.001 wt % to about 0.1 wt %;
    Al in a range from about 0.001 wt % to about 0.1 wt %;
    Si in a range from about 0.001 wt % to about 0.1 wt %; and
    Sn and inevitable impurities as remainders.

2. The lead-free solder of claim 1, wherein the lead-free solder is a non-Ag based solder.

3. A solder paste comprising a flux in a range from 5 to 25 parts by weight per 100 parts by weight of a lead-free solder, wherein the lead-free solder of 100 parts by weight has a composition of claim 2.

4. The lead-free solder of claim 1, further comprising at least one element selected from the group consisting of Ge in a range from about 0.001 wt % to about 0.05 wt %, Bi in a range from about 0.001 wt % to about 0.05 wt %, P in a range from about 0.001 wt % to about 0.05 wt %, and In in a range from about 0.001 wt % to about 0.05 wt %.

5. A solder paste comprising a flux in a range from 5 to 25 parts by weight per 100 parts by weight of a lead-free solder, wherein the lead-free solder of 100 parts by weight has a composition of claim 4.

6. The lead-free solder of claim 1, wherein the lead-free solder has an elongation rate in a range from about 45% to about 65%.

7. A solder paste comprising a flux in a range from 5 to 25 parts by weight per 100 parts by weight of a lead-free solder, wherein the lead-free solder of 100 parts by weight has a composition of claim 6.

8. The lead-free solder of claim 1, wherein the Al content is in a range from about 0.01 wt % to about 0.05 wt % and the Si content is in a range from about 0.001 wt % to about 0.02 wt %.

9. A solder paste comprising a flux in a range from 5 to 25 parts by weight per 100 parts by weight of a lead-free solder, wherein the lead-free solder of 100 parts by weight has a composition of claim 8.

10. A solder paste comprising a flux in a range from 5 to 25 parts by weight per 100 parts by weight of a lead-free solder, wherein the lead-free solder of 100 parts by weight has a composition of claim 1.

11. The primarily Sn lead free solder of claim 1 wherein the Sn content exceeds 99% by weight.

12. A semiconductor device comprising:
    a substrate in which a plurality of first terminals are formed;
    a semiconductor chip that is mounted on the substrate and comprises a plurality of second terminals that respectively correspond to the first terminals; and
    a plurality of primarily tin (Sn) solder bumps that respectively connect the corresponding first and second terminals, wherein the solder bumps comprise: Cu in a range from about 0.1 wt % to about 0.8 wt %, Pd in a range from about 0.001 wt % to about 0.1 wt %, Al in a range from about 0.001 wt % to about 0.1 wt %, Si in a range from about 0.001 wt % to about 0.1 wt %, and Sn and unavoidable impurities as balance.

13. The semiconductor device of claim 12 wherein the Sn content of the solder bumps exceeds 99% by weight.

* * * * *